United States Patent
Shah et al.

(10) Patent No.: US 9,042,735 B2
(45) Date of Patent: May 26, 2015

(54) OPTICAL TRANSCEIVER HAVING AN EXTRA AREA IN CIRCUIT BOARD FOR MOUNTING ELECTRONIC CIRCUITS

(75) Inventors: Jignesh Shah, San Jose, CA (US); Phillip Edwards, San Jose, CA (US)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 557 days.

(21) Appl. No.: 13/324,293

(22) Filed: Dec. 13, 2011

(65) Prior Publication Data

US 2013/0148977 A1    Jun. 13, 2013

(51) Int. Cl.
*H04B 10/40* (2013.01)
*H05K 1/14* (2006.01)
*H04B 10/00* (2013.01)

(52) U.S. Cl.
CPC ............... *H04B 10/40* (2013.01); *H05K 1/148* (2013.01); *H05K 1/144* (2013.01)

(58) Field of Classification Search
CPC ......... H04B 10/40; H05K 1/144; H05K 1/148
USPC ........................................... 398/138
See application file for complete search history.

(56) References Cited

U.S. PATENT DOCUMENTS

| | | | |
|---|---|---|---|
| 7,264,405 B2 | 9/2007 | Ikeuchi | |
| 7,309,173 B2 * | 12/2007 | Epitaux et al. | 385/92 |
| 7,416,353 B2 | 8/2008 | Yoshikawa et al. | |
| 8,057,109 B2 * | 11/2011 | Flens et al. | 385/92 |
| 8,328,435 B2 * | 12/2012 | Teo et al. | 385/92 |
| 8,380,073 B2 * | 2/2013 | Edwards et al. | 398/135 |
| 2009/0290619 A1 * | 11/2009 | Flens et al. | 375/219 |
| 2010/0080518 A1 * | 4/2010 | Teo et al. | 385/92 |
| 2012/0288240 A1 * | 11/2012 | Kondo et al. | 385/92 |
| 2012/0301152 A1 * | 11/2012 | Edwards et al. | 398/135 |
| 2012/0315051 A1 * | 12/2012 | Oomori et al. | 398/135 |
| 2013/0148977 A1 * | 6/2013 | Shah et al. | 398/135 |

* cited by examiner

*Primary Examiner* — Rhonda Peace

(74) *Attorney, Agent, or Firm* — Venable LLP; Michael A. Sartori; F. Brock Riggs

(57) ABSTRACT

An optical transceiver of one embodiment includes a transmitter optical subassembly to transmit an optical signal, a receiver optical subassembly to receive an optical signal, a mother board, a daughter board, and a housing. The mother board mounts electronic circuits that electrically communicate with the optical transmitter optical subassembly and the receiver optical subassembly. The daughter board mounts other electronic circuits that electrically communicate with the optical transmitter optical subassembly and the receiver optical subassembly. The daughter board has an extra area mounting a portion of the other electronic circuits. The housing defines a space for installing the optical transmitter optical subassembly, the receiver optical subassembly, the mother board, and the daughter board. The extra area is disposed outside the space.

9 Claims, 6 Drawing Sheets

OPTICAL TRANSCEIVER HAVING AN EXTRA AREA IN CIRCUIT BOARD FOR MOUNTING ELECTRONIC CIRCUITS

BACKGROUND

1. Field

Embodiments of the present invention relate to an optical transceiver implemented with both of an optical transmitter and an optical receiver, and particularly to an optical transceiver with a tunable optical transmitter for the WDM optical communication system.

2. Related Background Art

The Wavelength Division Multiplexing (WDM) optical communication system has been practical. One standard of the dense WDM (DWDM) communication system, which is one of the WDM standard, rules 100 grid wavelengths with a span of 50 GHz in the 1550 nm range (i.e. a frequency range of 192 THz-197 THz). A large sized optical signal source, such as transponder, has been conventionally applied to the DWDM system. The optical signal source, which typically installs a semiconductor laser diode (hereinafter denoted as "LD"), requires a precise temperature control for the LD.

SUMMARY

An optical transceiver, such as those described in U.S. Pat. No. 7,264,405 and No. 7,416,353, that is, an optical transceiver with a function of being temporally installed in the host system is going to be implemented with the tunable function. For this purpose, a tunable LD is necessary to be installed in the optical transceiver. In addition, it is necessary to install in the optical transceiver a large sized circuit to control the tunable LD. However, an interior space of the optical transceiver is limited. Therefore, a new circuit arrangement in the optical transceiver is required.

One aspect of the present invention relates to an optical transceiver. The transceiver according to the aspect includes a transmitter optical subassembly to transmit an optical signal, a receiver optical subassembly to receive an optical signal, a mother board, a daughter board, and a housing. The mother board mounts electronic circuits that electrically communicate with the optical transmitter optical subassembly and the receiver optical subassembly. The daughter board mounts other electronic circuits that electrically communicate with the optical transmitter optical subassembly and the receiver optical subassembly. The daughter board has an extra area that mounts a portion of the other electronic circuits. The housing defines a space for installing the optical transmitter optical subassembly, the receiver optical subassembly, the mother board, and the daughter board. The extra area is disposed outside the space.

In the optical transceiver, the extra area is disposed outside the space in which the optical transmitter optical subassembly, the receiver optical subassembly, the mother board, and the daughter board are installed. The optical transceiver allows the portion of the electronic circuits to be mounted in the extra area.

In one embodiment, the portion of the other electronic circuits of the daughter board may be a circuit operating in low frequencies or substantially in DC mode. Even when the circuit operating in low frequencies or substantially in DC mode is placed outside the space of the housing, the EMI noise from the circuit may be ignorable.

In one embodiment, the daughter board may further have a primary area and a necked portion provided between the primary region and the extra area, the necked portion may have a width narrower than those of the primary area and the extra area, the necked portion may have thereof a ground layer on a surface, and the ground layer may be electrically connected with the housing. According to the embodiment, the ground layer of the necked portion and the housing may realize the EMI shield. In one embodiment, the ground layer may directly contact with the housing.

In one embodiment, the optical transceiver may further include a shield gasket surrounding the necked portion, and the shield gasket may contact with the ground layer and the housing. In one embodiment, the housing may define a groove for receiving the shield gasket, and the shield gasket may be crushed in the groove. According to the embodiments, reliability of an electrical connection between the ground layer and the housing may be enhanced.

In one embodiment, the housing may include a first housing and a second housing that form the space therebetween, and the electrical plug and the extra area may be covered by the first housing. According to the embodiment, the electrical plug and the extra area disposed outside the space of the housing may be protected by the first housing. In one embodiment, the first housing may have an eave for covering the electrical plug, and the extra area may be disposed in another space defined by the eave.

In one embodiment, the housing may further include a rear block put between the first and second housings. The mother board may be put between the rear block and the second housing, and the daughter board may be put between the rear block and the first housing.

In one embodiment, the transmitter optical subassembly may install a tunable laser diode whose emission wavelength is controlled by a plurality biases

BRIEF DESCRIPTION OF THE DRAWINGS

The foregoing and other purposes, aspects and advantages will be better understood from the following detailed description of embodiments with reference to the drawings, in which.

DETAILED DESCRIPTION

Next, various embodiments will be described with reference to the accompanying drawings. In the description of the drawings, the same numeral or symbol will refer to the same element without overlapping explanations. In explanations herein, the terms describing directions, that is, "front", "back" and the likes are used for sake of the explanation. As described below, a direction in which an electrical plug exists with respect to an optical receptacle is referred as "rear" or "back", and the opposite direction is referred as "front" or "forth".

Figure 1:
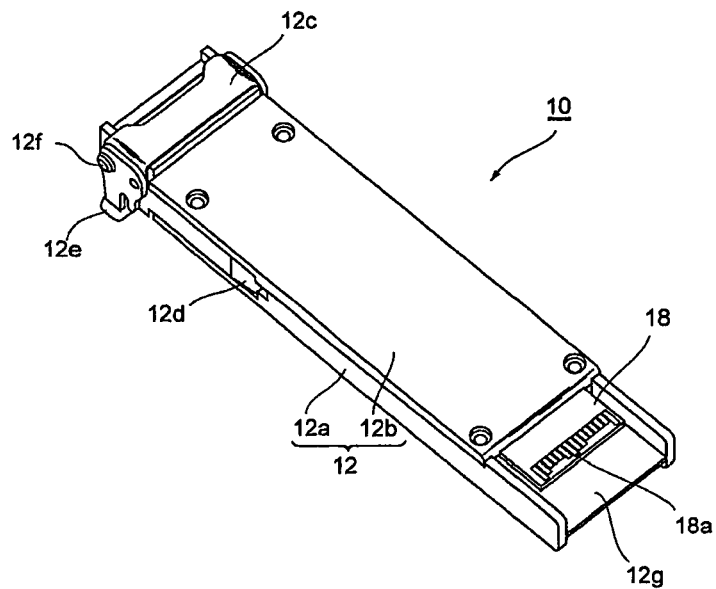
FIG. 1 is a perspective view illustrating an outer appearance of an optical transceiver according to one embodiment.
Figure 2:
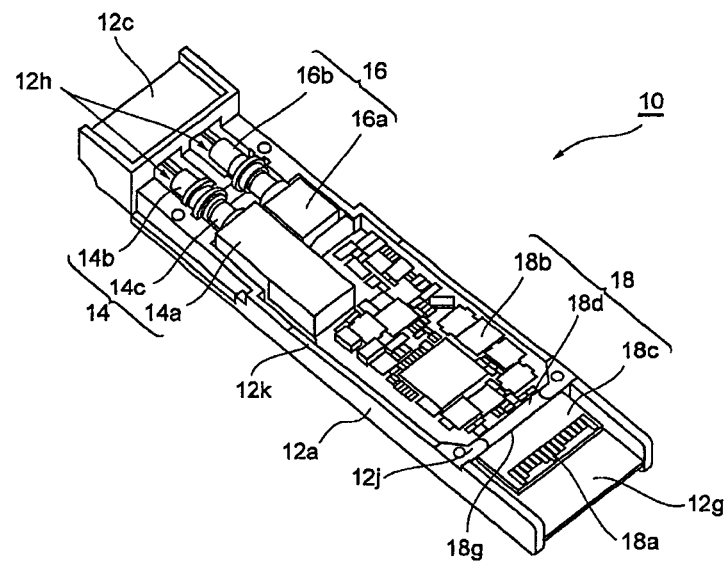
FIG. 2 is a perspective view illustrating an inside of the optical transceiver according to one embodiment.

FIG. 1 illustrates an outer appearance of an optical transceiver according to one embodiment. FIG. 2 illustrates an inside of an optical transceiver according to one embodiment. An optical transceiver 10 shown in FIG. 1 and FIG. 2 complies with XFP (i.e. 10 Gigabit Small Form Factor Pluggable) standard. The specifications of the standard are determined by a multi-source agreement. The optical transceiver includes a housing 12 substantially made of a metal. In one embodiment, the housing 12 includes a first housing 12a and a second housing 12b, and has a structure that is separable into up and down. FIG. 2 illustrates the optical transceiver 10 in a state where the second housing 12b is omitted.

Figure 8:
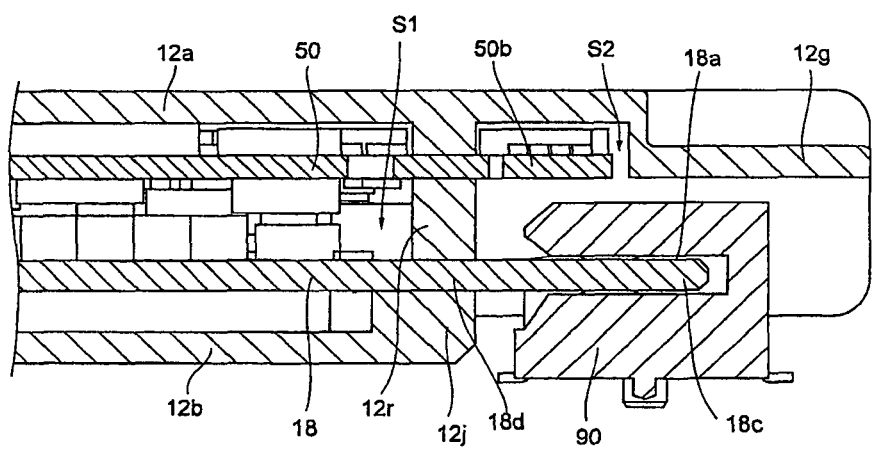
FIG. 8 illustrates a cross section of a portion of an optical transceiver of one embodiment taken along a longitudinal direction.

The housing 12 defines a space S1 between the first housing 12a and the second housing 12b (see FIG. 8). In the space S1 of the housing 12, a transmitter optical subassembly (hereinafter called as "TOSA") 14 that transmits an optical signal, a receiver optical subassembly (hereinafter called as "ROSA") 16 that receive an optical signal, and a mother board 18 is installed. The TOSA 14 and the ROSA 16 are electrically connected via flexible printed circuit (hereinafter called as "FPC") boards with electronic circuits that are mounted in the mother board 18.

The housing 12 has an optical receptacle 12c at the front side thereof. The optical receptacle 12c may engage with an external optical connector. Inserting the external optical connector into the optical receptacle and then inserting ferrules attached to tip ends of optical fibers of the external optical connector into sleeves of OSAs placed in the optical receptacle 12c, the optical fibers may be optically coupled with optical devices (i.e. a laser diode and a photodiode) that are provided in the OSAs. Thus, the XFP transceiver 1 may realize the full-duplex optical communication.

The housing 12 has a latch mechanism 12d. The latch mechanism 12d has a function that it engages with a cage prepared in a host system, and securely latches the optical transceiver 10 with the cage. The sides of the optical receptacle 12c support a bail 12e formed substantially U-shape. Rotating the bail 12e around pivots 12f provided on the sides of the optical receptacle 12c so as to traverse the front of the optical receptacle 12c, the rotational motion is converted into a motion in a longitudinal (i.e. back and forth) direction. The motion in the longitudinal direction enables the engagement between the latch mechanism 12d and the cage to be released. On the other hand, when the optical receptacle 12c engages with the external optical connector; the bail 12e can not be rotated, and the optical transceiver 10 can not be removed from the cage.

At the back side of the optical transceiver 10, a rear end of the mother board 18 is exposed on the outside of the housing 12. The rear end of the mother board 18 has an electrical plug 18a. The electrical plug 18a configures an interface for the optical transceiver 10 to electrically communicate with the host system. The electrical plug 18a may engage with an electrical connecter provided in a deep end of the cage of the host system.

The electrical plug 18a has a pattern including a plurality of electrodes. In the optical transceiver 10 complying with the XFP standard, the electrical plug 18a provides a total of 30 electrodes in both surfaces of the mother board 18. The mother board 18 includes a primary area 18b, an exposed area 18c including the rear end in which the electrical plug 18a is formed, and a necked portion 18d. The necked portion 18d is provided between the primary area 18b and the exposed area 18c, and has a width narrower than those of the primary area 18b and the exposed area 18c. As described later, in the optical transceiver 10, only the exposed area 18c among the areas of the mother board 18 is exposed from the space S1 of the housing 12, that is, a space provided between the first housing 12a and the second housing 12b. Electronic parts mounted in the mother board 18 and the interconnection electrically connecting the parts are housed in the space S1, and shielded by the housing 12. One surface of the exposed area 18c is exposed to the outside of the housing 12, but the other surface of the exposed area 18c faces an eave 12g of the first housing 12a. The eave covers and may protect the other surface of the exposed area 18c.

Referring to FIG. 2, in the optical transceiver 10, the TOSA 14 and the ROSA 16 have rectangular bodies 14a and 16a, respectively. Namely, the TOSA 14 and the ROSA 16 are called as a butterfly module. The TOSA 14 and the ROSA 16 have cylindrical sleeves 14b and 16b, respectively. The sleeves 14b and 16b extend forward from front walls of the bodies 14a and 16a, respectively. The sleeves 14b and 16b are inserted into cavities 12h defined by the optical receptacle 12c. The sleeves 14b and 16b may receive in the cavities 12h the ferrules of the external optical connecter.

Figure 3:
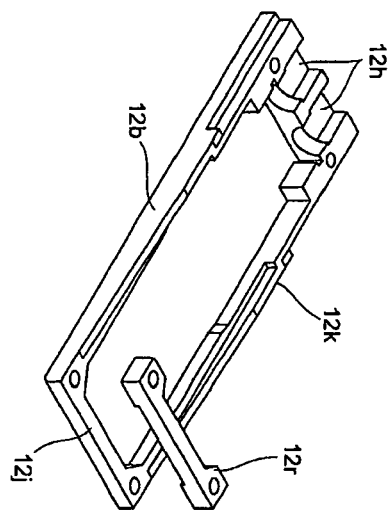
FIG. 3 is a perspective view illustrating a second housing and a rear block according to one embodiment.

FIG. 3 is a perspective view illustrating a second housing and a rear block according to one embodiment. Referring to FIG. 3 in addition to FIG. 2, the first housing 12a and the second housing 12b define the space S1 therebetween. The housing 12 includes a pair of side walls 12k, and a rear wall 12j. The side walls 12k define the space S1 therebetween from a direction perpendicular to the longitudinal direction of the optical transceiver 10. The rear wall 12j defines the space S1 from the rear side. The primary area 18b and the electronic circuits of the mother board 18 are set in the space S1.

In one embodiment, the rear wall 12 is configured with a rear wall of the first housing 12a, a rear wall of the second housing 12b, and a metal rear block 12r put between the rear walls of the first and second housings 12a, 12b. The rear wall of the second housing 12b and a rear block 12r define a path therebetween. A width of the path is narrower than a width of the space S1. The necked portion 18d of the mother board 18 is set in the path, which realizes positioning of the mother board with respect to the housing 12. In one embodiment, the necked portion 18d provides ground layers 18g on both primary surfaces thereof. The ground layers 18g contact with the second housing 12b and the rear block 12r.

Figure 4:
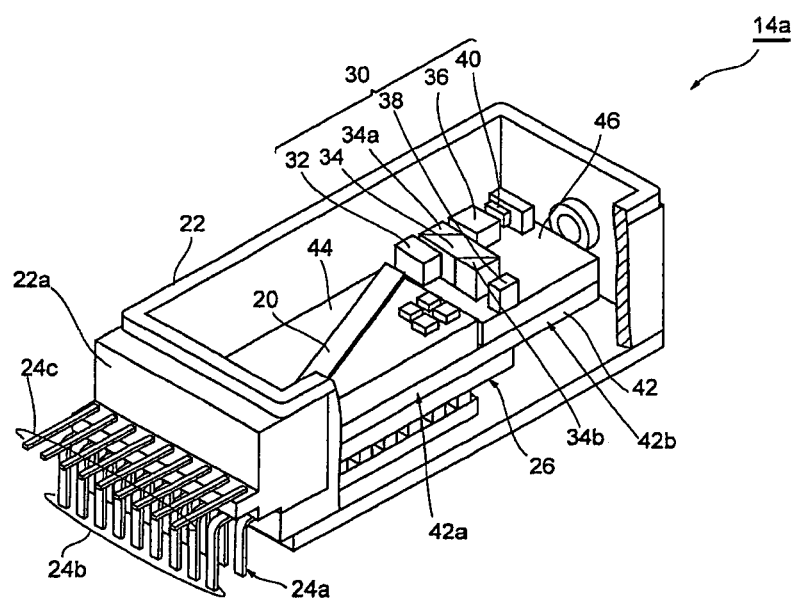
FIG. 4 is a perspective view illustrating a main body of a transmitter optical subassembly according to one embodiment.

Next, the TOSA 14 will be described. FIG. 4 is a perspective view illustrating a main body of a transmitter optical subassembly according to one embodiment. As shown in FIG. 4, the body 14a of the TOSA 14 includes a case 22. The TOSA 14 has a laser diode (hereinafter referred as "LD") 20 in the case 22. In one embodiment, the LD 20 is a tunable laser diode in which an optical modulator region of Mach-Zehnder type and a laser region are integrated. The laser region of LD 20 has a structure of, what is called, the CSG-DBR (Chirped Sampled Grating Diffraction Bragg Reflector), and includes a gain region, a tuning region, and an optical amplifier region. The LD 20 modulates laser light from the laser region by the optical modulator region to output the modulated light as an optical signal.

A plurality of lead pins extend from a rear wall 22a of the case 22. The case 22 may be made of metal, but a portion of the case 22 from which the lead pins are extracted is made of ceramics to secure the electrical isolation between the lead pins and the case 22. In one embodiment, the lead pins are arranged in three rows to configure lead pin groups 24a, 24b, 24c. The lead pins of the lead pin group 24c supply signals including high-frequency components. The lead pins of the lead pin groups 24a and 24b supply signals including DC component or low-frequency components.

In one embodiment, the TOSA 14 includes a temperature controller (TEC) 26 for controlling a temperature of the LD 20. The temperature controller 26 has a plurality of Peltier elements provided between top and bottom plates.

In one embodiment, the TOSA 14 has an optical system 30 for fixing a wavelength of the output light of the LD 20. In one embodiment, the optical system 30 includes a lens 32, an optical branching element 34, an etalon filter 36, a first photodiode 38, and a second photodiode 40.

The light output from the LD 20 is condensed by the lens 32 and then enters the optical branching element 34. The optical branching element 34 includes a first prism 34a (i.e. a first optical coupler) and a second prism 34b (i.e. a second optical coupler). The first prism 34a divides the light entering the optical branching element 34 or the light from the lens 32 to output first light and second light. The ratio of intensity of the first light to intensity of the second light may be arbitrarily, and be, for instance, 90:10. The second light enters the etalon filter 36. The light transmitted through the etalon filter 36 enters the second photodiode 40. The first light enters the second prism 34b. The second prism 34b divides the first light to output third light and fourth light. The third light enters the first photodiode 38. The fourth light travels toward the optical coupling portion 14c.

The first photodiode 38 senses the intensity of the light output from the LD 20, and the second diode 40 senses the light transmitted thorough the etalon filter 36. The etalon filter 36 has the periodic transmittance with respect to the wavelength. In one embodiment, the period of the transmittance roughly corresponds to a span between grids of the WDM optical communication standard. Controlling the temperature of the LD 20 with the temperature controller 26 based on the sensed intensity of the second photodiode 40, the TOSA 14 may control the emission wavelength of the LD 20 so that the emission wavelength is aligned with one of the ITU-T grids. In the TOSA 14, the optical system 30 and the LD 20 are supported by the temperature controller 26. The temperatures of the optical system 30 and the LD 20 are precisely controlled by the temperature controller 26.

In one embodiment, the TOSA 14 has a base 42, a base 44, and a base 46. The temperature controller 26 supports the base 42. The base 42 includes a first region 42a and a second region 42b. Mounted on the first region 42a is the base 44, and mounted on the second region 42b is the base 46. The base 44 mounts the LD 20 thereon, and the base 46 mounts the optical system 30 thereon.

Figure 5:
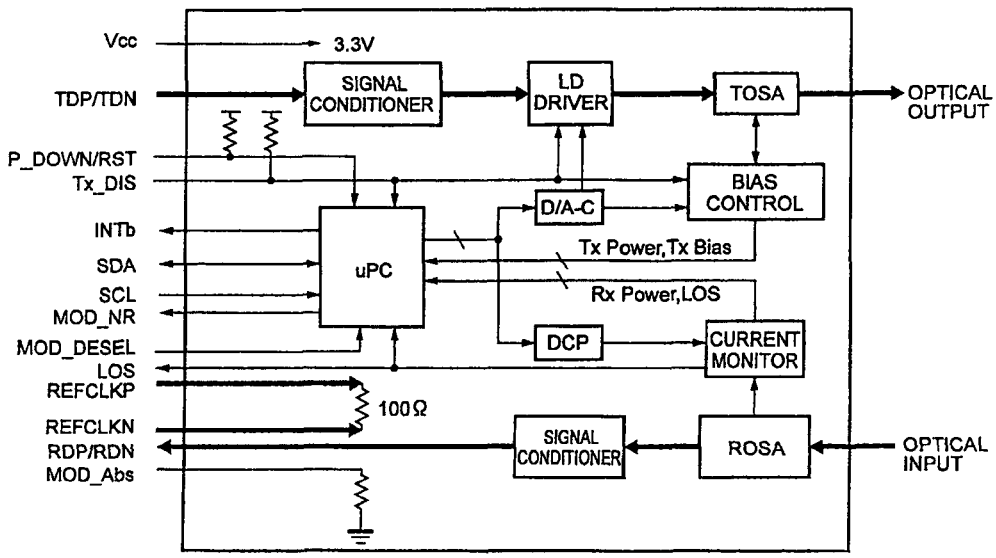
FIG. 5 is a block diagram illustrating an electrical circuit of an optical transceiver according to one embodiment.

Next, circuit configuration of the optical transceiver 10 will be described. FIG. 5 is a block diagram illustrating an electrical circuit of an optical transceiver according to one embodiment. Generally, an optical transceiver of a XFP type communicates with the host system by the differential signals for each of a TOSA and a ROSA. In FIG. 5, the differential signals for the TOSA are denoted by TDP and TDN, while the differential signals for the ROSA are denoted by RDP and RDN. In addition to those signals, four command/status signals (P_DOWN/RST, Tx_DIS, LOS, MOD_DESEL), four communication signals (SDA, SCL, INTb, MOD_NR) for communicating with a processor, and two clocks (REFCLKP and REFCLKN) complementary to the others, the power supply Vcc and the ground are prepared by the XFP standard. These signals including the power supply Vcc and the ground are transmitted through the electrical plug 18a.

In one embodiment, the optical transceiver 10 installs a tunable LD 20 in the TOSA 14, and an avalanche photodiode (hereinafter referred as "APD") in the ROSA 16. Biases for the tunable LD and the APD, and several power supplies have to be appropriately set, to operate these optical devices and electrical devices including an LD-driver for the tunable LD 20 and a signal processor for the APD in a speed equal to or greater than 10 Gbps. In addition, five biases are necessary for the aforementioned three regions of the laser region of the LD 20, to set the emission wavelength $\lambda$ and the power of the emission in predetermined values matching to the DWDM standard.

Further, in a case where the LD 20 has the optical modulator region of the Mach-Zehnder (MZ) type, the optical modulator region is also necessary to be biased by several power supplies independent to the others. Moreover, to keep the temperatures of the laser region and the optical modulator region in constant, a power supply for the temperature controller 26 is necessary. Thus, the optical transceiver 10 with the function of the wavelength tunable transmitter is necessary to prepare a plurality of power supplies, which are independently controllable. However, the communication with the host system is strictly limited through the plug 18a with 30 electrodes, which may provide only one type of power supply with a voltage of 3.3 V. Therefore, the optical transceiver 10 needs to have a voltage converting function for providing a plurality of types of the power supplies from the power supply of 3.3 V therein.

Figure 6:
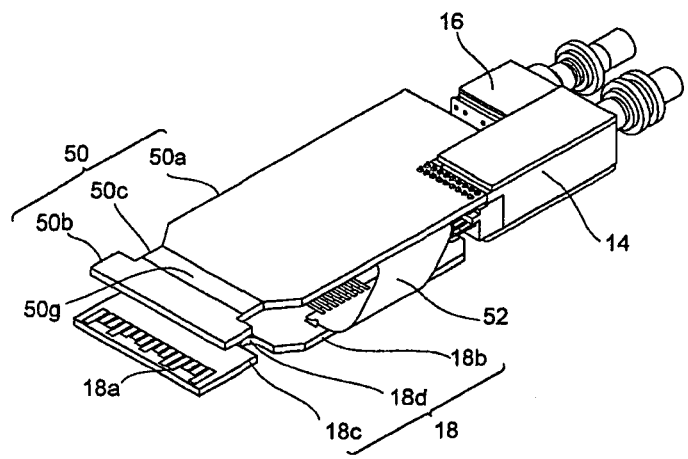
FIG. 6 is a perspective view illustrating assembled parts installed in a housing of an optical transceiver according to one embodiment.
Figure 7:
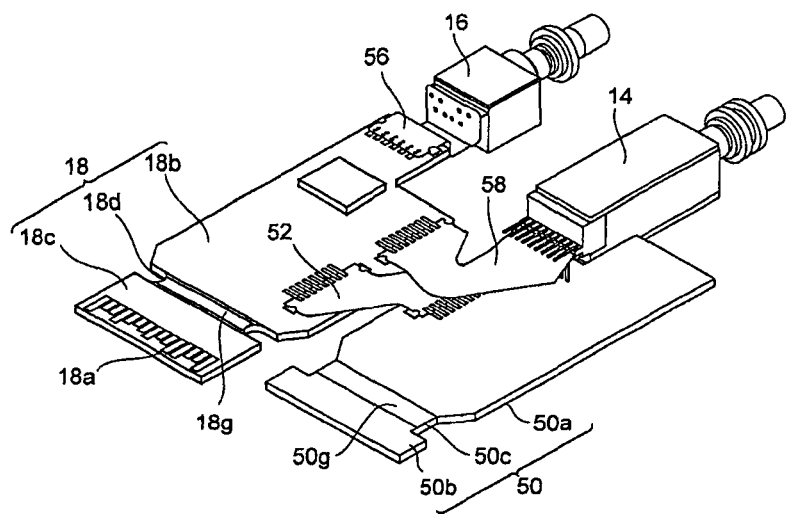
FIG. 7 is a perspective view illustrating assembled parts installed in a housing of an optical transceiver according to one embodiment.

Accordingly, the optical transceiver 10 has two circuit boards, namely, a daughter board 50 in addition to the mother board 18 described above. Next, FIG. 6 and FIG. 7 will be referred. Each of FIGS. 6 and 7 is a perspective views illustrating assembled parts installed in a housing of an optical transceiver according to one embodiment. The daughter board 50 mounts electronic circuits other than the electronic circuits of the mother board 18 therein. The electronic circuits mounted in the daughter board 50 are electrically connected to the TOSA 14 and the ROSA 16. The mother board 18 and the daughter board 50 are electrically connected with each other via a FPC board 52. The FPC board 52 is folded from a state shown in FIG. 7 so that the mother board 18 and the daughter board face each other, as shown in FIG. 6. The mother board 18, the daughter board 50, the TOSA 14 and the ROSA 16 are set in the housing 12 in an assembled state shown in FIG. 6.

The daughter board 50 has a primary area 50a and an extra area 50b. The primary area 50a faces the primary area 18b of the mother board 18, and is set in the space S1. The extra area 50b of the daughter board 50 faces the exposed area 18c of the mother board 18. The extra area 50b mounts a portion of the electronic circuits of the daughter board 18 therein. The extra area 50b has a dimension of about 14×7 mm$^2$.

FIG. 8 illustrates a cross section of a portion of an optical transceiver of one embodiment taken along a longitudinal direction. In FIG. 8, a cross section of a rear portion of the optical transceiver 10 is shown in a state where the electrical plug 18a is coupled with the electrical connector 90 of the host system. As illustrated in FIG. 8, the extra area 50b is provided outside of the space S1 defined by the housing 12.

The region where the extra area 50b is arranged is not completely EMI-shielded. However, in the optical transceiver 10, the extra area 50b mounts therein the electronic circuits operating in low frequencies or substantially DC signals, or the electronic circuits for which the EMI shielding may not be taken into account.

As already described, in one embodiment, the optical transceiver 10 has the outer shape following the standard of the XFP pluggable transceiver. According to the standard, it is required that a rear portion of the optical transceiver 10 provides the rear wall 12j in the rear portion of the housing 12, and the first housing 12a provides the eave 12g in the rear portion. According to the standard, it is required that the first housing 12a defines a recessed space (hereinafter referred as "pocket") S2 between the rear wall 12j and the eave 12g. However, the standard has not mentioned how the pocket S2 to be processed or utilized.

In the optical transceiver 10, the daughter board 50 extends to the pocket S2, and the extra area 50b is provided in the pocket S2. The extra area 50b, as described above, has the dimension of 14×7 $mm^2$, which is about 10% of the primary area 50a. Mounting the electronic circuits also in the extra area 50b allows the optical transceiver 10 to install therein the large scale of the electronic circuit that is necessary for the tunable optical transceiver.

Moreover, because the circuits mounted in the extra area 50b operates in lower frequencies or in substantially DC mode, the EMI shielding for those circuits is substantially unnecessary to be taken into account. The electronic circuit mounted in the extra area 50b, or the electronic circuit operating in lower frequencies or in substantially DC mode, for example, is a bias control circuit shown in FIG. 5. The bias control circuit is utilized, for example, to set a bias of the temperature controller 26, to set a bias of the LD 20, or the like.

In one embodiment, the daughter board 50 may further include a necked portion 50c provided between the primary area 50a and the extra area 50b. The necked portion 50c has a width narrower than those of the primary area 50a and the extra area 50b. The necked portion 50c has ground layers 50g on both main surfaces thereof (see, FIGS. 6 and 7). As shown in FIG. 8, the ground layers 50g contact with the first housing 12a and the rear block 12r. Therefore, even when the daughter board 50 extends outside of the space S1, the space S1 is shielded by the housing 12, and the primary area 50a set in the space S1 may be securely electromagnetically-protected.

Figure 9:
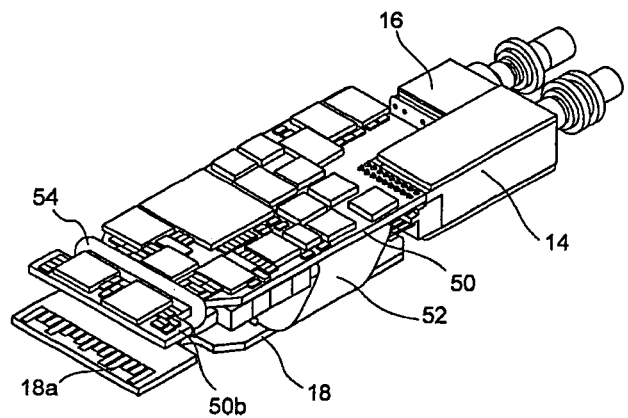
FIG. 9 is a perspective view illustrating assembled parts installed in a housing of an optical transceiver according to another embodiment.
Figure 10:
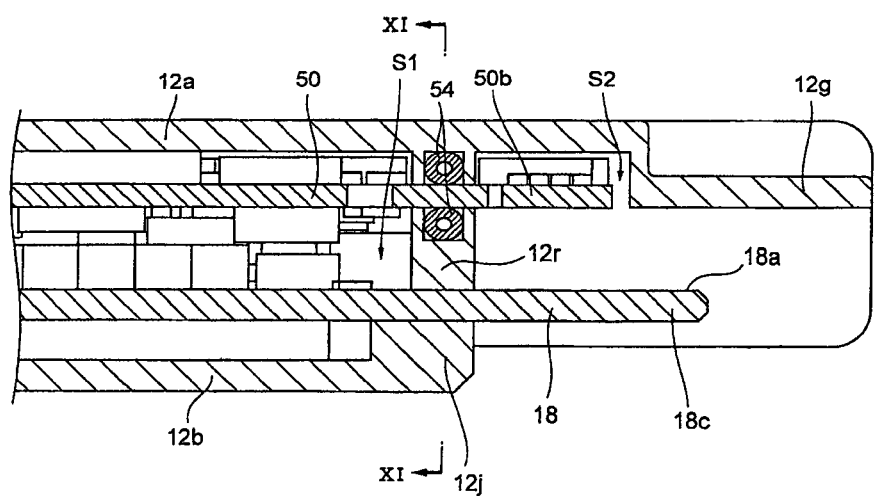
FIG. 10 illustrates a cross section of a portion of an optical transceiver of another embodiment taken along a longitudinal direction.

Next, another embodiment will be described. FIG. 9 is a perspective view illustrating assembled parts installed in a housing of an optical transceiver according to another embodiment. FIG. 10 illustrates a cross section of a portion of an optical transceiver of another embodiment taken along a longitudinal direction. In FIG. 10, a cross section of a rear portion of an optical transceiver according to another embodiment is illustrated. As shown in FIGS. 9 and 10, in another embodiment, a shield gasket 54 is provided along the surface of the necked portion 50c so as to surrounds the necked portion 50c. The gasket 54 has elasticity and electrical conductivity. The gasket 54 is made of, for example, silicone rubber with electrically conductive characteristic or rubber coated with metal.

As shown in FIG. 10, the rear wall of the first housing 12a and the rear block 12r provide a groove into which the gasket 54 is fitted. The depth of the groove is slightly less than a diameter of the gasket 54. Therefore, the gasket 54 may be crushed in the groove to be in securely contact with the housing 12.

Figure 11:
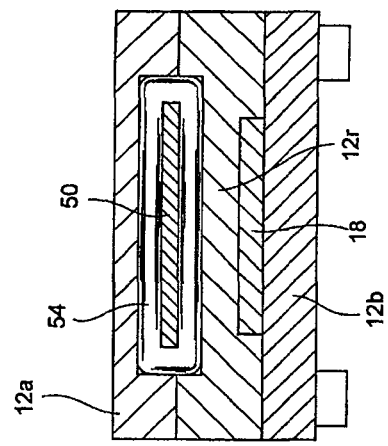
FIG. 11 illustrates a cross section taken in a direction of the arrows XI-XI shown in FIG. 10.

FIG. 11 illustrates a cross section taken in a direction of the arrows XI-XI shown in FIG. 10. As shown in FIG. 11, the mother board 18 is put between the rear wall of the second housing 12b and the rear block 12r. Substantially no gap is formed against the second housing 12b and the rear block 12r. On the other hand, the daughter board 50 is put between the first housing 12a and the rear block 12r through the shield gasket 54. The gasket 54 surrounding the necked portion 50c deforms so as to extend along the four corners of the necked portion 50c, which allows the gasket 54 and the daughter board 50 to securely contact with each other. Thus, the gasket 54 may enhance the EMI shielding of the optical transceiver 10.

The connection between the circuits mounted in the extra area 50b and those in the space S1 of the housing 12 may be realized by configuring the daughter board 50 with a multi-layered board and providing in the multi-layered board an inner wiring layer, which is not exposed in the surface of the daughter board 50.

Next, the assembling procedure of the optical transceiver according to the embodiment will be described. First, the TOSA 14, and the ROSA 16 are electrically connected to the mother board 18 and the daughter board 50. Specifically, the ROSA 16 is connected to the mother board 18 via a FPC board 56. In addition, some lead pins of the TOSA 14 is connected to the mother board 18 via an RF FPC board 58, and the other lead pins of the TOSA 14 is directly connected to the daughter board 50. The RF FPC board 58 transmits high frequency signals, and the lead pins directly connected to the daughter board 50 transmits low frequency or substantially DC signals, such as power supplies. In one embodiment, the mother board 18 mounts therein electronic circuits for processing high frequency signals. By connecting the RF FPC boards 58 to the mother board 18, it is possible to prevent the high frequency signals from being degraded.

Next, the daughter board 50 and the TOSA 14 are set on a predetermined position on the first housing 12a, and then the necked portion 50c of the daughter board 50 is put between the rear wall of the first housing 12a and the rear block 12r. Next, the FPC boards 52 and 58 are folded so that the mother board 18 and the daughter board 50 face each other. Next, the second housing 12b is assembled with the first housing 12a, and the first housing 12a and the second housing 12b are fastened with the rear block 12r by screws. Thus, the mother board 18, the daughter board 50, the TOSA 14 and the ROSA 16 are assembled with the housing 12.

Although the present invention has been fully described in conjunction with the embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. An optical transceiver comprising:
   a transmitter optical subassembly to transmit an optical signal;
   a receiver optical subassembly to receive an optical signal;
   a mother board having an electrical plug in one end thereof, the mother board mounting electronic circuits that electrically communicate with the transmitter optical subassembly and the receiver optical subassembly;
   a daughter board mounting other electronic circuits that electrically communicate with the transmitter optical subassembly and the receiver optical subassembly, the daughter board having an extra area mounting a portion of the other electronic circuits thereon; and a housing defining a space for installing the transmitter optical subassembly, the receiver optical subassembly, the mother board, and the daughter board, wherein the daughter board further has a primary area and a necked portion provided between the primary region and the extra area, the necked portion has a width narrower than a width of the primary area and a width of the extra area, the necked portion has a ground layer on a surface of the daughter board, and the ground layer is electrically connected with the housing, and wherein the extra area is disposed outside the space.

2. The optical transceiver of claim 1, wherein the portion of the other electronic circuits is a circuit operating in low frequencies.

3. The optical transceiver of claim 2,
wherein the transmitter optical subassembly installs a tunable laser diode whose emission wavelength is controlled by a plurality of biases provided from the portion of the other electronic circuits mounted on the extra area.

4. The optical transceiver of claim 1, wherein the ground layer is in contact with the housing.

5. The optical transceiver of claim 1, further comprising a shield gasket surrounding the necked portion, the shield gasket being in contact with the ground layer and the housing.

6. The optical transceiver of claim 5, wherein the housing provides a groove for receiving the shield gasket, the shield gasket being crushed in the groove.

7. The optical transceiver of claim 1,
wherein the housing includes a first housing and a second housing that form the space therebetween, the electrical plug being disposed in the outside of the space, the electrical plug and the extra area being covered by the first housing.

8. The optical transceiver of claim 7, wherein the first housing has an eave for covering the electrical plug of the mother board, and
the eave defines another space in which the extra area of the daughter board is disposed.

9. The optical transceiver of claim 7,
wherein the housing further includes a rear block put between the first and second housings, the mother board being put between the rear block and the second housing, the daughter board being put between the rear block and the first housing.

* * * * *